(12) United States Patent
Murakami et al.

(10) Patent No.: US 7,728,598 B2
(45) Date of Patent: Jun. 1, 2010

(54) METHOD AND APPARATUS FOR ESTIMATING THE CHARGE/DISCHARGE ELECTRICITY AMOUNT OF SECONDARY BATTERIES

(75) Inventors: Yusai Murakami, Hamamatsu (JP); Norito Yamabe, Toyohashi (JP)

(73) Assignee: Panasonic EV Energy Co., Ltd., Kosai-Shi (JP)

( * ) Notice: Subject to any disclaimer, the term of this patent is extended or adjusted under 35 U.S.C. 154(b) by 0 days.

(21) Appl. No.: 12/478,221

(22) Filed: Jun. 4, 2009

(65) Prior Publication Data

US 2009/0261836 A1    Oct. 22, 2009

Related U.S. Application Data

(62) Division of application No. 10/565,956, filed as application No. PCT/JP2004/010983 on Jul. 26, 2004, now Pat. No. 7,557,584.

(30) Foreign Application Priority Data

Jul. 29, 2003   (JP)   ............................. 2003-282037
Jul. 9, 2004    (JP)   ............................. 2004-202931

(51) Int. Cl.
    *G01N 27/416*   (2006.01)
(52) U.S. Cl. ........................ 324/429; 320/132; 320/149
(58) Field of Classification Search ........................ None
    See application file for complete search history.

(56) References Cited

U.S. PATENT DOCUMENTS

| 5,703,469 A | 12/1997 | Kinoshita |
| 6,160,380 A | 12/2000 | Tsuji et al. |
| 2004/0239333 A1 | 12/2004 | Kikuchi |

FOREIGN PATENT DOCUMENTS

| JP | 08-336202 | 12/1996 |
| JP | 2000-014019 | 1/2000 |
| JP | 2001-223033 | 8/2001 |

*Primary Examiner*—Edward Tso
*Assistant Examiner*—Ramy Ramadan
(74) *Attorney, Agent, or Firm*—Workman Nydegger

(57) ABSTRACT

An apparatus estimates charge/discharge electricity amount without being affected by current measurement error. Under specific selection conditions, a no-load voltage calculation part uses pairs of data consisting of current data I(n) and voltage data V(n) corresponding to the current data to calculate a no-load voltage $V_{sep}$ as the voltage intercept at a current of zero in a straight-line approximation obtained by statistical processing such as regression analysis using a least squares method. If specific current conditions exist for a certain amount of time, an open circuit voltage calculation part calculates the terminal voltage of the secondary battery as the open circuit voltage $V_{oc}$. An estimated charge/discharge electricity amount calculation part uses a preset change-in-voltage adjustment constant $\Delta V_{bc}$/adjustment coefficient $K_b$, change-in-electromotive-force constant $K_{eq}$ and polarization voltage generation constant $K_{pol}$ to calculate the estimated charge/discharge electricity amount $\Delta Q_e$ as a function of the change $\Delta V_b$ in the no-load or open circuit voltage over a predetermined period of time.

23 Claims, 6 Drawing Sheets

METHOD AND APPARATUS FOR ESTIMATING THE CHARGE/DISCHARGE ELECTRICITY AMOUNT OF SECONDARY BATTERIES

CROSS-REFERENCE TO RELATED APPLICATION

This application is a divisional of U.S. patent application Ser. No. 10/565,956 filed Jan. 26, 2006 now U.S. Pat. No. 7,557,584 which was a §371 U.S. Nationalization of PCT/JP2004/010983 filed Jul. 26, 2004 which claimed priority to Japanese patent application number 2003-282037 filed Jul. 29, 2003 and Japanese patent application number 2004-202931 filed Jul. 9, 2004 the entire disclosure of said applications are expressly incorporated by reference herein.

TECHNICAL FIELD

The present invention relates to a technique for estimating the state of charge (SOC) of nickel metal hydride (Ni-MH) batteries and other secondary batteries installed in a pure electric vehicle (PEV) or a hybrid electric vehicle (HEV) or the like as the source of motive power for the motors and the source of driving power for various loads.

BACKGROUND ART

Conventionally in an HEV, the state of charge (SOC) of a secondary battery is estimated by computation from the detected voltage, current, temperature and other aspects of the secondary battery, and then SOC control is performed in order to optimize the fuel efficiency of the vehicle. In order to perform SOC control accurately, the SOC of the secondary battery must be estimated accurately as it is discharged and charged.

A conventional method for performing this SOC estimation is carried out as follows. First, the battery voltage V and the discharge or charge current I are measured over a predetermined period of time, and the integral ∫I of that current is calculated. In addition, a temperature T, a battery voltage V, and a function of the current integral ∫I are used to update the previous estimate of the polarization voltage of the cell $V_c(t-1)$ to $V_c(t)$, and find a correction voltage $V'(=V-V_c(t))$, and then a plurality of pairs of data, each pair consisting of the correction voltage V' and the current I, are obtained and stored. From these pairs of data, regression analysis is used to find a first-order straight-line approximation (voltage V'-current I straight-line approximation), and the V intercept of the V'-I straight-line approximation is estimated to be the electromotive force E. The SOC is then estimated from the previous estimate of SOC, electromotive force E, the temperature T and the function of the current integral ∫I (e.g., JP 2001-223033A).

However, the conventional method for estimating SOC described above has the following problems.

First of all, the discharging or charging current flowing through the secondary battery is measured by a current sensor in order to estimate the SOC. When used in a HEV or the like, this current sensor must measure a large current and using a high-precision sensor would mean increased cost, so that the practical situation is such that it is necessary to use a low-cost and relatively imprecise sensor. For this reason, the current value detected by the current sensor contains a measurement error and this current error results in an error in the estimation of the SOC. Particularly in cases in which the rate of discharging or charging is smaller than the current error (cases such as when the current error is ±2 A compared to a rate of discharging or charging of 1 A), the behavior of the estimated SOC becomes extremely strange.

In addition, in the conventional method for estimating the SOC described above wherein the previous estimate of the polarization voltage of the cell $V_c(t-1)$ is updated to $V_c(t)$ as a function of the integral of the current measured by this current sensor so that the effect of the polarization voltage is taken into consideration, the previously calculated polarization voltage contains a current error, so that this current error becomes an error in the estimation of the polarization voltage and these errors accumulate, resulting in a problem wherein the error between the estimated value and the true value of the SOC becomes greater with the passage of time.

DISCLOSURE OF INVENTION

The present invention came about in light of the problems with the prior art described above and has as its object to provide a method and apparatus for estimating the charge/discharge electricity amount and the polarization voltage without being affected by current measurement error, and particularly to provide a method and apparatus that is able to estimate the SOC with high precision even when the current values therein contain measurement error.

In order to achieve the object, the method for estimating a charge/discharge electricity amount of a secondary battery according to the present invention comprises: a step of measuring a pair of data consisting of the current flowing through the secondary battery and the terminal voltage of the secondary battery corresponding to this current, thus obtaining a plurality of pairs of data, a step of, in the case that specific selection conditions (for example, conditions that the value of the current on the charging or the discharging is within a predetermined range (e.g., ±50 A), that the number of the plurality of pairs of data is greater than or equal to a predetermined number on the charging and the discharging (e.g., 10 pairs each out of 60 samples), and that the charge/discharge electricity amount during the collection of the plurality of pairs of data is within a predetermined range (e.g., 0.3 Ah)) are satisfied, calculating a no-load voltage ($V_{sep}$) as a voltage intercept at a current of zero in a straight-line approximation obtained by statistical processing such as regression analysis using a least squares method with respect to the plurality of pairs of data, and, a step of, in the case that specific current conditions (e.g., conditions that the absolute value of the current is less than 10 amperes) or voltage conditions (e.g. conditions that the change in the voltage is less than 1 volt) continue to be met for a certain amount of time (e.g., 10 seconds), calculating an open circuit voltage ($V_{oc}$) from the terminal voltage of the secondary battery, a step of calculating a change ($\Delta V_b$) in the no-load voltage or the open circuit voltage over a predetermined period of time (e.g., 1 minute), and a step of calculating the estimated charge/discharge electricity amount ($\Delta(Q_e)$) of the secondary battery based on the change in the no-load voltage or the open circuit voltage.

The method for estimating a charge/discharge electricity amount of a secondary battery according to the present invention further comprises: a step of setting in advance an adjustment constant ($\Delta(V_{bc})$) and adjustment coefficient ($K_b$) for the change ($\Delta V_b$) in the no-load voltage or the open circuit voltage that are determined depending on the physical properties and the state of charging or discharging of the secondary battery, a step of setting in advance an electromotive force change constant ($K_{eq}$), which is the change in the electromotive force with respect to the charge/discharge electricity amount in the usable domain of state of charge (SOC), that is determined depending on the physical properties and the state of charging or discharging of the secondary battery, and a step of setting in advance a polarization voltage generation constant ($K_{pol}$), which is the change in the polarization voltage with respect to the charge/discharge electricity amount in the usable domain of state of charge (SOC), that is determined depending on the physical properties and the state of charging or discharging of the secondary battery, wherein the estimated charge/discharge electricity amount $\Delta Q_e$ is calculated as a function of the change $\Delta V_b$ in the no-load voltage or the open circuit voltage using an equation expressed as:

$$\Delta Q_e = K_b \times (\Delta V_b + \Delta V_{bc})/(K_{eq} + K_{pol}).$$

In addition, the method for estimating a charge/discharge electricity amount of a secondary battery according to the present invention further comprises: a step of calculating the measured charge/discharge electricity amount ($\Delta Q_m$) over a predetermined period of time from the current flowing through the secondary battery, a step of calculating the polarization voltage ($V_{pol}$) of the secondary battery based on the measured charge/discharge electricity amount, a step of calculating the electromotive force ($V_{eq}$) of the secondary battery based on the measured charge/discharge electricity amount, and a step of calculating the change in the polarization voltage ($\Delta V_{pol}$) and the change in the electromotive force ($\Delta V_{eq}$) over a predetermined period of time, wherein in the step of calculating the estimated charge/discharge electricity amount, the estimated charge/discharge electricity amount ($\Delta Q_e$) is calculated based on the change in the polarization voltage, the change in the electromotive force and the change in the no-load voltage or the open circuit voltage.

In this case, the step of calculating the estimated charge/discharge electricity amount comprises a step of calculating a compensation coefficient ($\alpha$) with respect to the measured charge/discharge electricity amount based on the change in the polarization voltage, the change in the electromotive force and the change in the no-load voltage or the open circuit voltage, wherein the estimated charge/discharge electricity amount ($\Delta Q_e$) is calculated by multiplying the measured charge/discharge electricity amount ($\Delta Q_m$) by the compensation coefficient.

Here, when $\Delta V_{pol}$ is the change in the polarization voltage, $\Delta V_{eq}$ is the change in the electromotive force, $\Delta V_b$ is the change in the no-load voltage or the open circuit voltage, and $\alpha$ is the compensation coefficient, the compensation coefficient $\alpha$ is expressed as:

$$\alpha = \Delta V_b / (\Delta V_{pol} + \Delta V_{eq}).$$

In the step of calculating the polarization voltage, the polarization voltage ($V_{pol}$) is calculated based on the measured charge/discharge electricity amount ($\Delta Q_m$) and the polarization voltage ($V_{ppre}$) calculated based on the estimated charge/discharge electricity amount ($\Delta Q_e$) calculated a predetermined amount of time previously.

In addition, in the step of calculating the electromotive force, the electromotive force ($V_{eq}$) is calculated based on the measured charge/discharge electricity amount ($\Delta Q_m$) and the electromotive force ($V_{epre}$) calculated based on the estimated charge/discharge electricity amount ($\Delta Q_e$) calculated a predetermined amount of time previously.

In the step of calculating the polarization voltage, the polarization voltage is calculated with reference to a polarization voltage-charge/discharge electricity amount characteristic prepared in advance with temperature as a parameter.

In the step of calculating the electromotive force, the electromotive force is calculated with reference to an electromotive force-state of charge characteristic prepared in advance with temperature as a parameter, based on the sum of the measured charge/discharge electricity amount and the state of charge calculated a predetermined amount of time previously.

In order to achieve the object, the method for estimating a polarization voltage of a secondary battery according to the present invention comprises: a step of calculating the estimated charge/discharge electricity amount ($\Delta Q_e$) using the method for estimating a charge/discharge electricity amount of a secondary battery according to the present invention, and a step of recalculating the polarization voltage ($V_{pe}$) of the secondary battery based on the estimated charge/discharge electricity amount.

In order to achieve the object, the method for estimating a state of charge of a secondary battery according to the present invention comprises: a step of calculating the estimated charge/discharge electricity amount ($\Delta Q_e$) using the method for estimating a charge/discharge electricity amount of a secondary battery according to the present invention, and a step of calculating the state of charge (SOC) of a secondary battery based on the estimated charge/discharge electricity amount.

In order to achieve the object, the apparatus for estimating the charge/discharge electricity amount of a secondary battery according to the present invention comprises: a current measurement part that measures current flowing through the secondary battery as current data (I(n)), a voltage measurement part that measures the terminal voltage of the secondary battery as voltage data (V(n)), a no-load voltage calculation part that obtains a plurality of pairs of data consisting of current data from the current measurement part and voltage data corresponding to this current data from the voltage measurement part, and that, in the case that specific selection conditions (for example, conditions that the value of the current on the charging or the discharging is within a predetermined range (e.g., ±50 A), that the number of the plurality of pairs of data is greater than or equal to a predetermined number on the charging or the discharging (e.g., 10 pairs each out of 60 samples), and that the charge/discharge electricity amount during the collection of the plurality of pairs of data is within a predetermined range (e.g., 0.3 Ah)) are satisfied, calculates the no-load voltage ($V_{sep}$) as the voltage intercept at a current of zero in a straight-line approximation obtained by statistical processing such as regression analysis using a least squares method with respect to the plurality of pairs of data, and, an open circuit voltage calculation part that, in the case that specific current conditions (e.g., conditions that the absolute value of the current is less than 10 amperes) or voltage conditions (e.g. conditions that the change in the voltage is less than 1 volt) continue to be met for a certain amount of time (e.g., 10 seconds), calculates the open circuit voltage ($V_{oc}$) from the terminal voltage of the secondary battery, a change-in-measured-voltage calculation part that calculates the change ($\Delta V_b$) in the no-load voltage or the open circuit voltage over a predetermined period of time (e.g., 1 minute), and an estimated charge/discharge electricity amount calculation part that calculates the estimated charge/discharge electricity amount ($\Delta Q_e$) of the secondary battery based on the change in the no-load voltage or the open circuit voltage.

The apparatus for estimating the charge/discharge electricity amount of a secondary battery according to the present invention further comprises: a change-in-voltage adjustment constant/adjustment coefficient setting part that sets in advance an adjustment constant ($\Delta V_{bc}$) and an adjustment coefficient ($K_b$) for the change ($\Delta V_b$) in the no-load voltage or the open circuit voltage that are determined depending on the physical properties and the state of charging or discharging of the secondary battery, a change-in-electromotive-force constant setting part that sets in advance a change-in-electromotive-force constant ($K_{eq}$), which is the change in the electromotive force with respect to the charge/discharge electricity amount in the usable domain of state of charge, that is determined depending on the physical properties and the state of charging or discharging of the secondary battery, and a polarization voltage generation constant setting part that sets in advance a polarization voltage generation constant ($K_{pol}$), which is the change in the polarization voltage with respect to the charge/discharge electricity amount in the usable domain of state of charge, that is determined depending on the physical properties and the state of charging or discharging of the secondary battery, wherein the estimated charge/discharge electricity amount calculation part calculates the estimated charge/discharge electricity amount $\Delta Q_e$ as a function of the change $\Delta V_b$ in the no-load voltage or the open circuit voltage using an equation expressed as:

$$\Delta Q_e = K_b \times (\Delta V_b + \Delta V_{bc}) / (K_{eq} + K_{pol}).$$

In addition, the apparatus for estimating the charge/discharge electricity amount of a secondary battery according to the present invention further comprises: a measured charge/discharge electricity amount calculation part that calculates the measured charge/discharge electricity amount ($\Delta Q_m$) over a predetermined period of time (e.g., 1 minute) from the current flowing through the secondary battery, a polarization voltage calculation part that calculates the polarization voltage ($V_{pol}$) of the secondary battery based on the measured charge/discharge electricity amount, and an electromotive force calculation part that calculates the electromotive force ($V_{eq}$) of the secondary battery based on the measured charge/discharge electricity amount, a change-in-polarization-voltage calculation part that calculates the change in the polarization voltage ($\Delta V_{pol}$) over the predetermined period of time (e.g., 1 minute), and a change-in-electromotive-force calculation part that calculates the change in the electromotive force ($\Delta V_{eq}$) over a predetermined period of time (e.g., 1 minute), wherein the estimated charge/discharge electricity amount calculation part calculates the estimated charge/discharge electricity amount ($\Delta Q_e$) based on the change in the polarization voltage, the change in the electromotive force and the change in the no-load voltage or the open circuit voltage.

In this case, the estimated charge/discharge electricity amount calculation part comprises a compensation coefficient calculation part that calculates a compensation coefficient ($\alpha$) with respect to the measured charge/discharge electricity amount based on the change in the polarization voltage, the change in the electromotive force and the change in the no-load voltage or the open circuit voltage, wherein the estimated charge/discharge electricity amount ($\Delta Q_e$) is calculated by multiplying the measured charge/discharge electricity amount ($\Delta Q_m$) by the compensation coefficient.

Here, when $\Delta V_{pol}$ is the change in the polarization voltage, $\Delta V_{eq}$ is the change in the electromotive force, $\Delta V_b$ is the change in the no-load voltage or the open circuit voltage, and $\alpha$ is the compensation coefficient, the compensation coefficient $\alpha$ is expressed as:

$$\alpha = \Delta V_b / (\Delta V_{pol} + \Delta V_{eq}).$$

The polarization voltage calculation part calculates the polarization voltage ($V_{pol}$) based on the measured charge/discharge electricity amount ($\Delta Q_m$) and the polarization voltage ($V_{ppre}$) calculated based on the estimated charge/discharge electricity amount ($\Delta Q_e$) calculated a predetermined amount of time previously.

In addition, the electromotive force calculation part calculates the electromotive force ($V_{eq}$) based on the measured charge/discharge electricity amount ($\Delta Q_m$) and the electromotive force ($V_{epre}$) calculated based on the estimated charge/discharge electricity amount ($\Delta Q_e$) calculated a predetermined amount of time previously.

The apparatus for estimating the charge/discharge electricity amount of a secondary battery according to the present invention further comprises: a temperature measurement part that measures the temperature of the secondary battery as temperature data, wherein: the polarization voltage calculation part calculates the polarization voltage with reference to a polarization voltage-charge/discharge electricity amount characteristic prepared in advance with the temperature data ($T(n)$) from the temperature measurement part as a parameter.

In addition, the electromotive force calculation part calculates the electromotive force with reference to an electromotive force-state of charge (SOC) characteristic prepared in advance with the temperature data ($T(n)$) from the temperature measurement part as a parameter, based on the sum of the measured charge/discharge electricity amount and the state of charge (SOC) calculated a predetermined amount of time previously.

In order to achieve the object, the apparatus for estimating the polarization voltage of a secondary battery according to the present invention comprises: a polarization voltage recalculation part that recalculates the polarization voltage ($V_{pe}$) of the secondary battery based on the estimated charge/discharge electricity amount ($\Delta Q_e$) calculated by the apparatus for estimating the charge/discharge electricity amount of a secondary battery according to the present invention.

In order to achieve the object, the apparatus for estimating the state of charge (SOC) of a secondary battery according to the present invention comprises: a state of charge (SOC) calculation part that calculates the state of charge (SOC) of a secondary battery based on the estimated charge/discharge electricity amount ($\Delta Q_e$) calculated by the apparatus for estimating the charge/discharge electricity amount of a secondary battery according to the present invention.

With the present invention, an estimated charge/discharge electricity amount that does not contain current measurement error can be calculated from a measured voltage (no-load voltage or open circuit voltage) that is not greatly affected by current measurement error, or from a measured charge/discharge electricity amount that contains current measurement error, and by using this estimated charge/discharge electricity amount, it is possible to calculate a polarization voltage and SOC that do not depend on current measurement error. Accordingly, it is possible to increase the precision of estimation of the SOC and thus increase battery life and improve battery protection and control by SOC management.

BEST MODE FOR CARRYING OUT THE INVENTION

Here follows a detailed description of preferred embodiments of the present invention, made with reference to the drawings.

Embodiment 1

Figure 1:
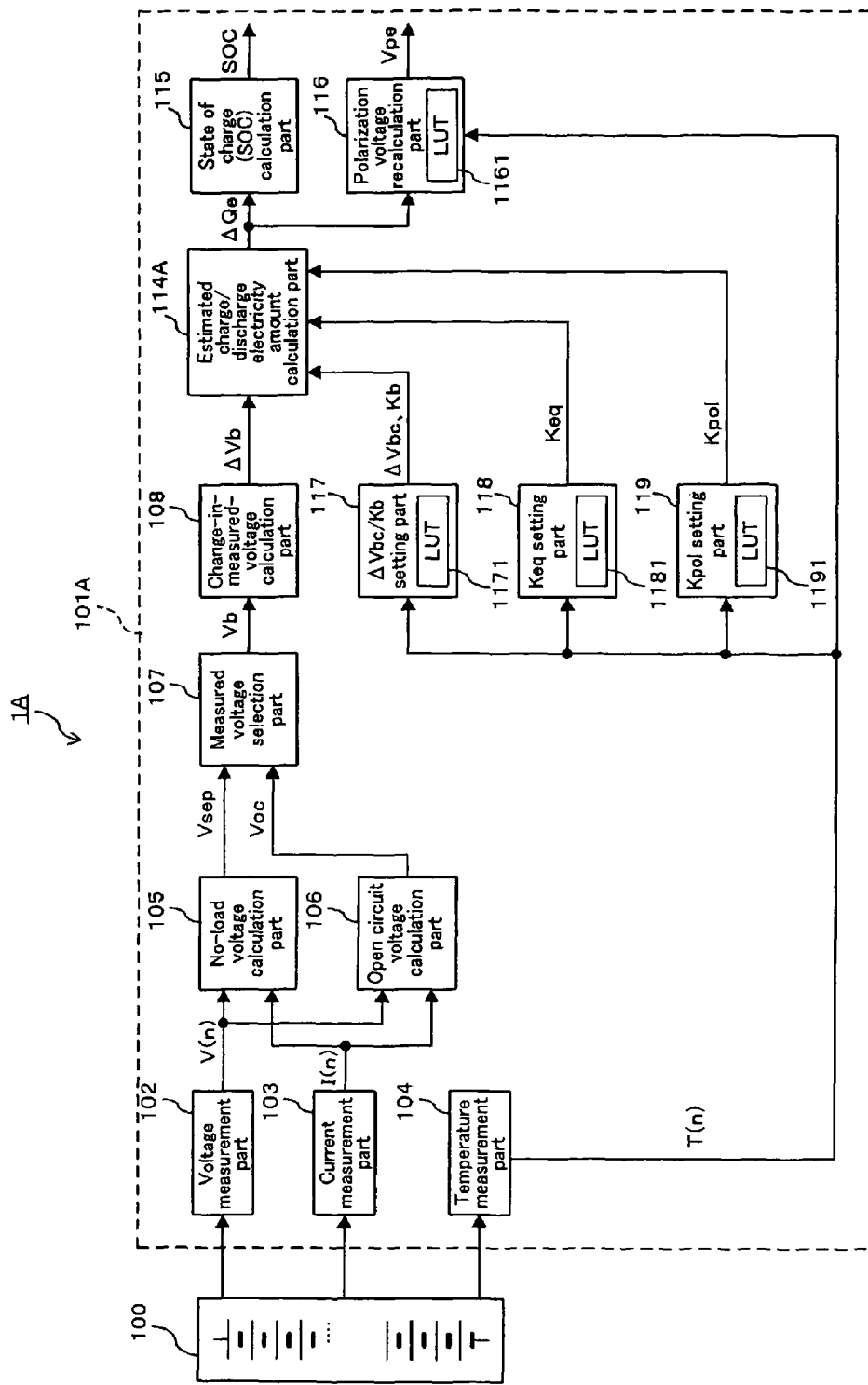
FIG. 1 is a block diagram of an example of the constitution of a battery pack system according to Embodiment 1 of the present invention.

FIG. 1 is a block diagram of an example of the constitution of a battery pack system according to Embodiment 1 of the present invention. In FIG. 1, a battery pack system 1A includes a battery pack 100 and a battery ECU 101A containing the apparatus for estimating state of charge (SOC) according to the present invention as a portion of a microcomputer system.

When the battery pack 100 is installed in a HEV or the like, in order to obtain the desired output to the motor, the battery pack 100 generally has a configuration in which a plurality of cells or battery modules such as nickel-metal hydride batteries are connected electrically in series to form a battery block, and further a plurality of the battery blocks are connected electrically in series.

Within the battery ECU 101A, 102 is a voltage measurement part that measures the terminal voltage of each battery block within the battery pack 100 detected by voltage sensors (not shown) at a predetermined sampling frequency to obtain voltage data V(n); 103 is a current measurement part that measures the charging/discharging current of the battery pack 100 detected by current sensors (not shown) at a predetermined sampling frequency to obtain current data I(n) (the sign of which indicates either the charging or discharging direction); and 104 is a temperature measurement part that measures the temperature of each battery block within the battery pack 100 detected by temperature sensors (not shown) at a predetermined sampling frequency to obtain temperature data T(n).

The voltage data V(n) from the voltage measurement part 102 and the current data I(n) from the current measurement part 103 are input as a pair of data to a no-load voltage calculation part 105. The no-load voltage calculation part 105 first determines that the pair of data consisting of voltage data V(n) and current data I(n) are valid upon meeting specific selection conditions: that the value of current data I(n) in the charging (−) or discharging (+) is within a predetermined range (e.g., ±50 A), that the number of items of current data I(n) in the discharging and the charging is greater than or equal to a predetermined number (e.g., 10 pairs each out of 60 samples), and that the charge/discharge electricity amount during the collection of the pair of data is within a predetermined range (e.g., 0.3 Ah)).

Next, the no-load voltage calculation part 105 finds a first-order voltage-current line (straight-line approximation) from the valid pair of data by statistical processing such as regression analysis using the method of least squares or other techniques, and then calculates the no-load voltage $V_{sep}$ as the voltage value at a current of zero (voltage intercept).

The voltage data V(n) and current data I(n) also are provided as input to an open circuit voltage calculation part 106. If specific current conditions (e.g., the absolute value of current data I(n) is less than 10 A) or voltage conditions (e.g. the change in voltage data V(n) is less than 1 V) continue to be met for a certain amount of time (e.g., 10 s), the open circuit voltage calculation part 106 takes the average value $V_{ave}$ of the voltage data V(n) from the various battery blocks, adds the resistance value of the component $R_{com}$ multiplied by the average value $I_{ave}$ of the current data I(n), and thus calculates the open circuit voltage $V_{oc}$ corrected for the voltage loss due to the component resistance ($V_{oc}=V_{ave}+R_{com} \times I_{ave}$).

The no-load voltage $V_{sep}$ from the no-load voltage calculation part 105 and the open circuit voltage $V_{oc}$ from the open circuit voltage calculation part 106 are provided as input to a measured voltage selection part 107, and here, if the selection conditions given above are met, the no-load voltage $V_{sep}$ is selected, but if the selection conditions are not satisfied and the current conditions or voltage conditions given above continue to be met for a certain amount of time, then the open circuit voltage $V_{oc}$ is selected and output as the measured voltage $V_b$. Note that if neither of the conditions is met, then a pair of data consisting of voltage data V(n) and current data I(n) is again obtained.

The measured voltage $V_b$ from measured voltage selection part 107 is provided as input to a change-in-measured-voltage calculation part 108. Here, the change in the measured voltage $V_b$ (change in measured voltage) $\Delta V_b$ over a predetermined period of time (e.g., 1 minute) is calculated.

A change-in-voltage adjustment constant ($\Delta V_{bc}$)/adjustment coefficient ($K_b$) setting part 117 presets the adjustment constant $\Delta V_{bc}$ and adjustment coefficient $K_b$ for a change $\Delta V_b$ in the measured voltage $V_b$ based on the adjustment constant $\Delta V_{bc}$ and adjustment coefficient $K_b$ for the change in voltage with temperature as a parameter that are stored in advance in a look-up (reference) table (LUT) 1171, depending on the polarization characteristics determined by the physical properties of the secondary battery and the voltage attenuation characteristics determined by the state of charging or discharging (usage) of the secondary battery. For example, 0.01 volt (V) is stored in the LUT 1171 as the adjustment constant $\Delta V_{bc}$ for the change in voltage at a temperature of 25° C. The adjustment coefficient $K_b$ is a coefficient set appropriately to match an actual system.

A change-in-electromotive-force constant ($K_{eq}$) setting part 118 presets the change-in-electromotive-force constant $K_{eq}$ from the slope of the characteristic curve of the change-in-electromotive-force constant $K_{eq}$ with respect to the charging (or discharging) electricity amount in the usable domain of the SOC (e.g., in the range of 20% to 80%) with temperature as a parameter based on the temperature data T(n) measured by the temperature measurement part 104. The characteristic curve is stored in advance in a look-up (reference) table (LUT) 1181, depending on the physical properties and the state of charging or discharging (usage) of the secondary battery. For example, 0.1 volt/ampere-hour (V/Ah) is stored in the LUT 1181 as the change-in-electromotive-force constant $K_{eq}$ at a temperature of 25° C.

A polarization voltage generation constant ($K_{pol}$) setting part 119 presets the polarization voltage generation constant $K_{pol}$ from the slope of the characteristic curve of the polarization voltage generation constant $K_{pol}$ with respect to the charging (or discharging) electricity amount with temperature as a parameter based on the temperature data T(n) measured by the temperature measurement part 104. The characteristic curve is stored in advance in a look-up (reference) table (LUT) 1191, depending on the physical properties and the state of charging or discharging (usage) of the secondary battery. For example, 0.1 volt/ampere-hour (V/Ah) is stored in the LUT 1191 as the polarization voltage generation constant $K_{pol}$ at a temperature of 25° C. and SOC of 60%.

The change in measured voltage $\Delta V_b$ from the change-in-measured-voltage calculation part 108, the change-in-voltage adjustment constant $\Delta V_{bc}$ and adjustment coefficient $K_b$ from the change-in-voltage adjustment constant/adjustment coefficient setting part 117, the change-in-electromotive-force constant $K_{eq}$ from the change-in-electromotive-force constant setting part 118 and the polarization voltage generation constant $K_{pol}$ from the polarization voltage generation constant setting part 119 are provided as input to an estimated charge/discharge electricity amount calculation part 114A. The estimated charge/discharge electricity amount calculation part 114A calculates the estimated charge/discharge electricity amount $\Delta Q_{ee}$ as a function of the change $\Delta V_b$ in the measured voltage $V_b$ using an equation expressed as:

$$\Delta Q_e = K_b \times (\Delta V_b + \Delta V_{bc})/(K_{eq} + K_{pol}).$$

The estimated charge/discharge electricity amount $\Delta Q_e$ is provided as input to a state of charge (SOC) calculation part 115, where the state of charge (SOC) of the battery blocks within the battery pack 100 are calculated based on the estimated charge/discharge electricity amount $\Delta Q_e$. Moreover, the estimated charge/discharge electricity amount $\Delta Q_e$ is provided as input to a polarization voltage recalculation part 116. The polarization voltage recalculation part 116 recalculates the polarization voltage $V_{pe}$ from a characteristic curve or formula of the polarization voltage $V_{pe}$ with respect to the estimated charge/discharge electricity amount $\Delta Q_e$ with the temperature as a parameter based on the temperature data T(n) measured by the temperature measurement part 104. The characteristic curve or formula is stored in advance in a look-up (reference) table (LUT) 1161.

Figure 2:
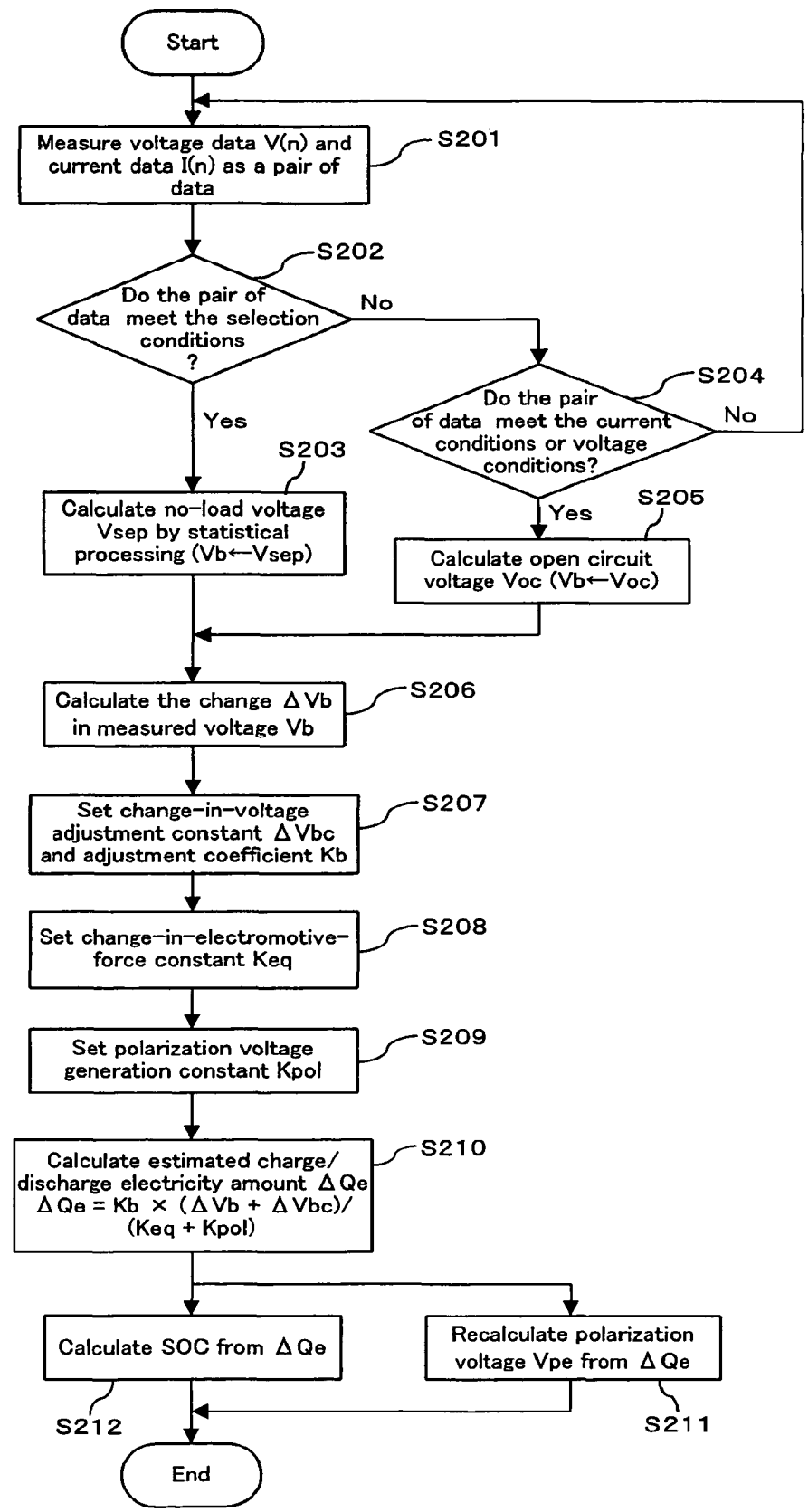
FIG. 2 is a flowchart illustrating the processing of the method of estimating the polarization voltage and the method of estimating the state of charge (SOC) included in the method of estimating the charge/discharge electricity amount of a secondary battery according to Embodiment 1 of the present invention.

Here follows a description of the process of estimating the polarization voltage and estimating the state of charge (SOC) in the battery pack system this embodiment constituted as above, with reference to FIG. 2.

FIG. 2 is a flowchart illustrating the processing of the method of estimating the polarization voltage and the method of estimating the state of charge (SOC) included in the method of estimating the charge/discharge electricity amount of a secondary battery according to Embodiment 1 of the present invention. In FIG. 2, the voltage data V(n) and current data I(n) first are measured as pairs of data (S201). Next, in order to determine whether or not the pairs of data of voltage data V(n) and current data I(n) measured in Step S201 are valid, a determination is made as to whether or not they satisfy the specific selection conditions described above (S202). If the specific selection conditions are met (Yes) in the determination of Step S202, then control advances to Step S203, where a predetermined number (e.g., 10 each in the charging and discharging out of 60 samples) of the valid pairs of data are obtained. Next, from the valid pairs of data is found a first-order straight-line approximation V–I straight-line approximation) by statistical processing such as regression analysis using the method of least squares or other techniques, and then the no-load voltage $V_{sep}$ is calculated as the V-intercept of this straight-line approximation and stored as the measured voltage $V_b(V_b \leftarrow V_{sep})$.

On the other hand, in the decision of Step S202, if the specific selection conditions are not met (No), control advances to Step S204, where a determination is made as to whether or not the current data I(n) continues to meet the specific current conditions or voltage conditions given above for a certain amount of time. In the decision of Step S204, if the specific current conditions (e.g., the absolute value of current data I(n) continues to be less than 10A for 10 seconds) are met (Yes) or voltage conditions (e.g. the change in voltage data V(n) continues to be less than 1 V for 10 seconds) are met (Yes), control advances to Step S205 where the open circuit voltage $V_{oc}$ is calculated as the average of the voltage data V(n) from the various battery blocks at that time, and the open circuit voltage $V_{oc}$ thus calculated is stored as the measured voltage $V_b(V_b \leftarrow V_{oc})$.

On the other hand, in the decision of Step S204, if the specific current conditions or voltage conditions are not met (No), control returns to Step S201 and pairs of data consisting of the voltage data V(n) and current data I(n) are measured again.

Next, the change in the measured voltage $V_b$ obtained in Step S203 or S205 (change in measured voltage) $\Delta V_b$ over a predetermined period of time (e.g., 1 minute) is calculated (S206).

Next, the change-in-voltage adjustment constant $\Delta V_{bc}$/adjustment coefficient $K_b$, change-in-electromotive-force constant $K_{eq}$ and polarization voltage generation constant $K_{pol}$ are set in advance (S207, S208 and S209), and the equation expressed as:

$$\Delta Q_e = K_b \times (\Delta V_b + \Delta V_{bc})/(K_{eq} + K_{pol})$$

is used to calculate the estimated charge/discharge electricity amount $\Delta Q_e$ as a function of the change $\Delta V_b$ in the measured voltage $V_b$ (S210).

Based on the estimated charge/discharge electricity amount $\Delta Q_e$ thus calculated, the polarization voltage $V_{pe}$ is recalculated (S211) and also the state of charge (SOC) is calculated (S212).

In this manner, the state of charge (SOC) and polarization voltage $V_{pe}$ in the battery blocks of the battery pack 100 are estimated.

Note that in this embodiment, a first-order function of the change $\Delta V_b$ in the no-load voltage or the open circuit voltage is used to calculate the estimated charge/discharge electricity amount $\Delta Q_e$, but an $N^{th}$-order function (where N is a natural number) or an exponential function also may be used.

Figure 3:
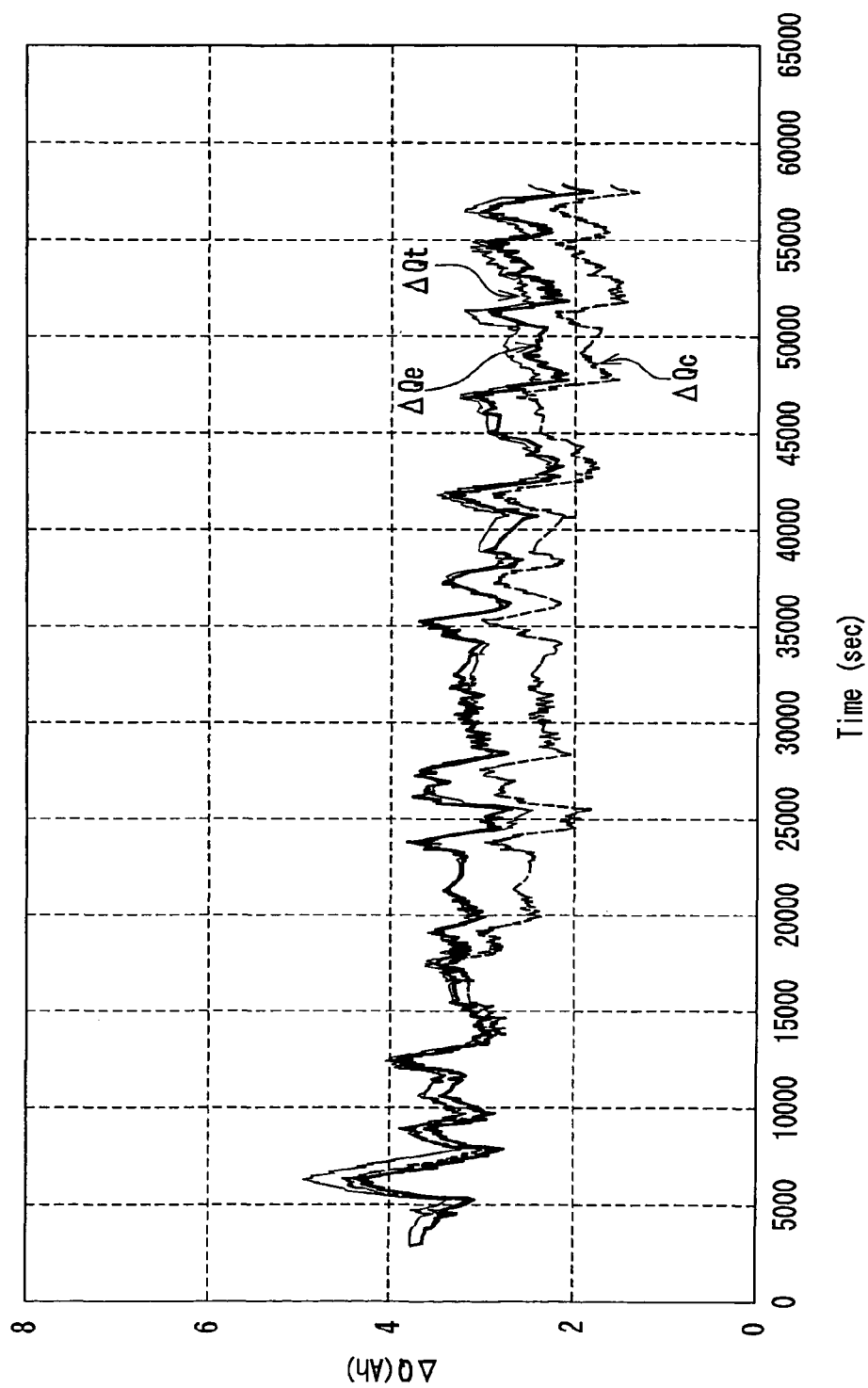
FIG. 3 is a graph of the change over time of: the estimated charge/discharge electricity amount $\Delta Q_e$ calculated based on the flowchart of FIG. 2, the estimated charge/discharge electricity amount $\Delta Q_c$ calculated by a method that does not use $\Delta V_{bc}$, $K_b$, $K_{eq}$, $K_{pol}$ or other constants and variables in the flowchart of FIG. 2, and the true charge/discharge electricity amount $\Delta Q_t$ calculated based on the integral of the current measured using a high-precision current sensor.

FIG. 3 is a graph of the change over time of: the estimated charge/discharge electricity amount $\Delta Q_e$ calculated based on the flowchart of FIG. 2, the estimated charge/discharge electricity amount $\Delta Q_c$ calculated by a method that does not use $\Delta V_{bc}$, $K_b$, $K_{eq}$, $K_{pol}$ or other constants and variables in the flowchart of FIG. 2, and the charge/discharge electricity amount $\Delta Q_t$ (referred to in this specification as the "true charge/discharge electricity amount") calculated based on the integral of the current measured using a high-precision current sensor (with no current error).

As shown in FIG. 3, with the present embodiment, the estimated charge/discharge electricity amount $\Delta Q_e$ approaches the true charge/discharge electricity amount $\Delta Q_t$.

Embodiment 2

Figure 4:
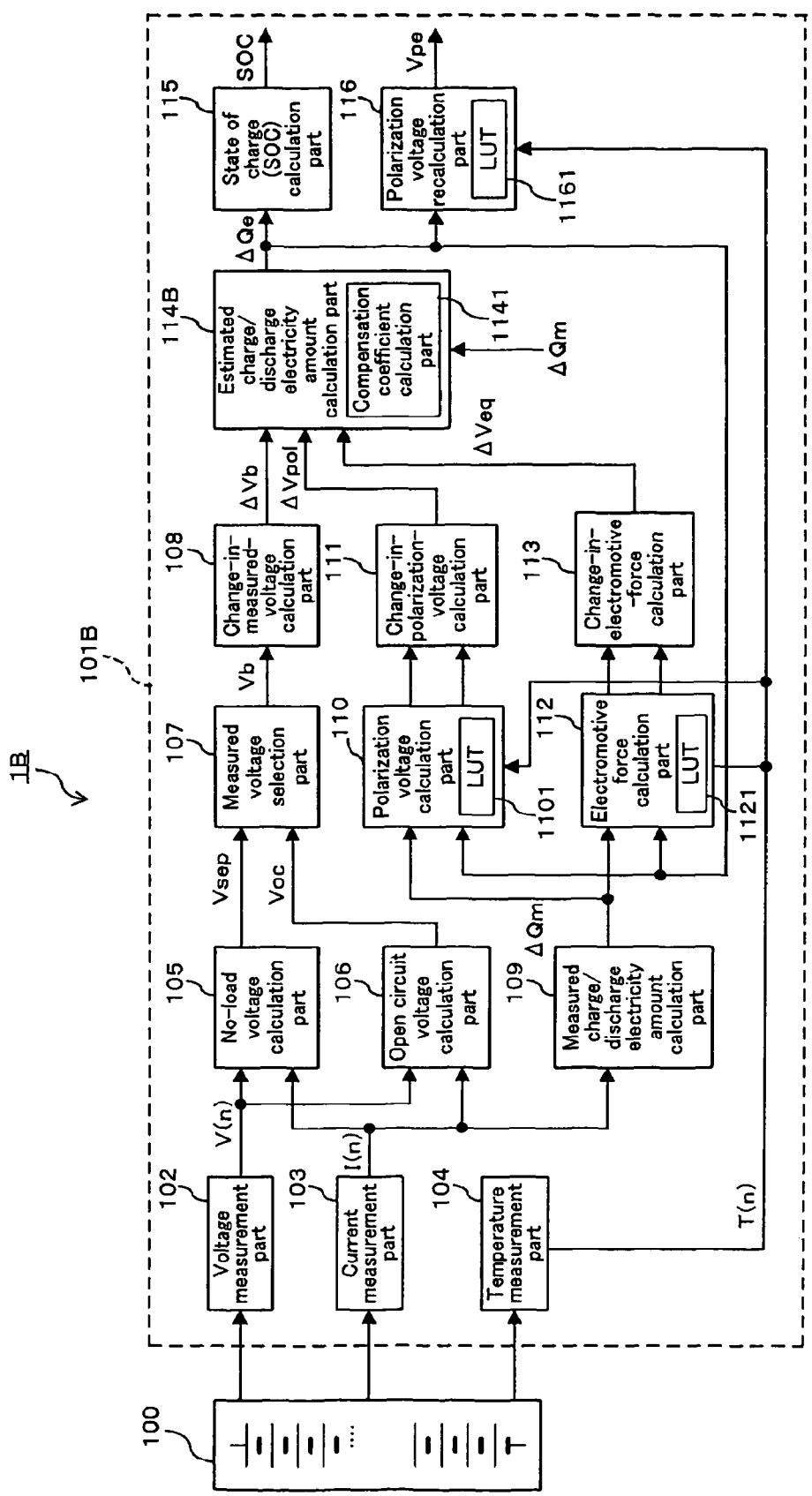
FIG. 4 is a block diagram of an example of the constitution of a battery pack system according to Embodiment 2 of the present invention.

FIG. 4 is a block diagrams of an example of the constitution of a battery pack system according to Embodiment 2 of the present invention. Note that those portions of FIG. 4 that have the same constitution and functions as in FIG. 1 referred to in the description of Embodiment 1 are given the same symbols and descriptions thereof are omitted.

The current data I(n) measured in the current measurement part 103 is input to a measured charge/discharge electricity amount calculation part 109. The measured charge/discharge electricity amount calculation part 109 calculates the measured charge/discharge electricity amount $\Delta Q_m$ over a predetermined period of time (e.g., 1 minute) from the current data I(n) in the charging and discharging.

The measured charge/discharge electricity amount $\Delta Q_m$ from the measured charge/discharge electricity amount calculation part 109 next is provided as input to a polarization voltage calculation part 110. The polarization voltage calculation part 110 calculates the polarization voltage $V_{pol}$ from a characteristic curve or formula of the polarization voltage $V_{pol}$ with respect to the measured charge/discharge electricity amount $\Delta Q_m$ with the temperature as a parameter based on the temperature data T(n) measured by the temperature measurement part 104. The characteristic curve or formula is stored in advance in a look-up (reference) table (LUT) 1101.

The polarization voltage $V_{pol}$ from the polarization voltage calculation part 110 next is provided as input to a change-in-polarization-voltage calculation part 111 where the change in the polarization voltage $V_{pol}$ (change in polarization voltage) $\Delta V_{pol}$ over a predetermined period of time (e.g., 1 minute) is calculated. The change in polarization voltage $\Delta V_{pol}$ is calculated by taking the polarization voltage $V_{pol}$ calculated based on the measured charge/discharge electricity amount $\Delta Q_m$ and subtracting the polarization voltage $V_{ppre}$ calculated based on the estimated charge/discharge electricity amount $\Delta Q_e$ that was calculated a predetermined amount of time (e.g., 1 minute) previously, as described later.

In addition, the measured charge/discharge electricity amount $\Delta Q_m$ from the measured charge/discharge electricity amount calculation part 109 also is provided as input to an electromotive force calculation part 112. The electromotive force calculation part 112 calculates the electromotive force $V_{eq}$ from a characteristic curve or formula of the electromotive force $V_{eq}$ with respect to the state of charge (SOC) with the temperature as a parameter based on the temperature data T(n) measured by the temperature measurement part 104. The characteristic curve or formula is stored in advance in a look-up (reference) table (LUT) 1121.

The electromotive force $V_{eq}$ from the electromotive force calculation part 112 next is provided as input to a change-in-electromotive-force calculation part 113 where the change in the electromotive force $V_{eq}$ (change in electromotive force) $\Delta V_{eq}$ over a predetermined period of time (e.g., 1 minute) is calculated. The change in electromotive force $\Delta V_{eq}$ is calculated by taking the electromotive force $V_{eq}$ calculated based on the measured charge/discharge electricity amount $\Delta Q_m$ and subtracting the electromotive force $V_{epre}$ calculated based on the estimated charge/discharge electricity amount $\Delta Q_e$ that was calculated a predetermined amount of time (e.g., 1 minute) previously, as described later.

The change in measured voltage $\Delta V_b$ from the change-in-measured-voltage calculation part 108 described in Embodiment 1, the change in polarization voltage $\Delta V_{pol}$ from the change-in-polarization-voltage calculation part 111, and the change in electromotive force $\Delta V_{eq}$ from the change-in-electromotive-force calculation part 113 are provided as input to an estimated charge/discharge electricity amount calculation part 114B. In the estimated charge/discharge electricity amount calculation part 114B, first, a compensation coefficient calculation part 1141 calculates a compensation coefficient $\alpha$ from the change in measured voltage $\Delta V_b$, change in polarization voltage $\Delta V_{pol}$ and change in electromotive force $\Delta V_{eq}$ as $\alpha = \Delta V_b/(\Delta V_{pol} + \Delta V_{eq})$. This compensation coefficient $\alpha$ is multiplied by the measured charge/discharge electricity amount $\Delta Q_m$ to calculate the estimated charge/discharge electricity amount $\Delta Q_e$.

The estimated charge/discharge electricity amount $\Delta Q_e$ thus calculated is supplied to the polarization voltage calculation part 110 and electromotive force calculation part 112, which calculate the polarization voltage $V_{ppre}$ and electromotive force $V_{epre}$, respectively, at a predetermined amount of time (e.g., 1 minute) previously.

The remainder of the constitution and functions are the same as in Embodiment 1.

Figure 5:
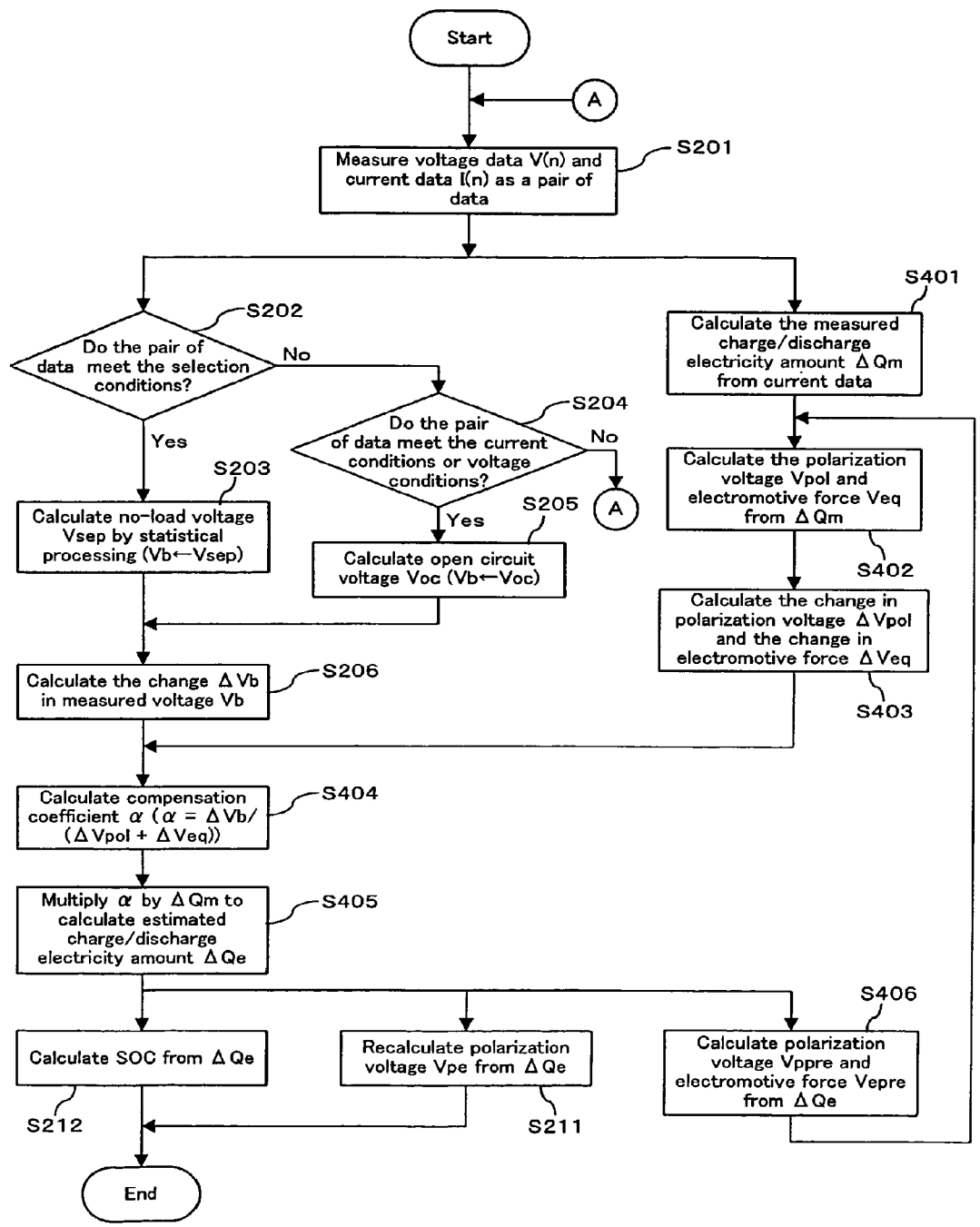
FIG. 5 is a flowchart illustrating the processing of the method of estimating the polarization voltage and the method of estimating the state of charge included in the method of estimating the charge/discharge electricity amount of a secondary battery according to Embodiment 2 of the present invention.

Here follows a description of the process of estimating the state of charge (SOC) and estimating the polarization voltage in the battery pack system this embodiment constituted as above, with reference to FIG. 5.

FIG. 5 is a flowchart illustrating the processing of the method of estimating the polarization voltage and the method of estimating the state of charge (SOC) included in the method of estimating the charge/discharge electricity amount of a secondary battery according to Embodiment 2 of the present invention. Note that those processes of FIG. 5 that have the same process steps as in FIG. 2 referred to in the description of Embodiment 1 are given the same symbols and descriptions thereof are omitted.

In Step S401, the measured charge/discharge electricity amount $\Delta Q_m$ over a predetermined period of time (e.g., 1 minute) is calculated from the current data I(n) in the charging and discharging. Next, the polarization voltage $V_{pol}$ and electromotive force $V_{eq}$ are calculated respectively based on the measured charge/discharge electricity amount $\Delta Q_m$ calculated, the polarization voltage $V_{ppre}$ and electromotive force $V_{epre}$, that are calculated based on the estimated charge/discharge electricity amount $\Delta Q_e$ calculated a predetermined period of time (e.g., 1 minute) previously in Step S406 (S402). Moreover, the change in polarization voltage $\Delta V_{pol}$ and change in electromotive force $\Delta V_{eq}$ are calculated from the polarization voltage $V_{pol}$ and electromotive force $V_{eq}$ thus calculated (S403).

Next, the change in measured voltage $\Delta V_b$ calculated in Step S206, the change in polarization voltage $\Delta V_{pol}$ and change in electromotive force $V_{eq}$ calculated in Step S403 are used to calculate the compensation coefficient $\alpha$ as $\alpha = \Delta V_b/(\Delta V_{pol} + \Delta V_{eq})$(S404). The compensation coefficient $\alpha$ thus calculated is multiplied by the measured charge/discharge electricity amount $\Delta Q_m$ calculated in Step S401 to calculate the estimated charge/discharge electricity amount $\Delta Q_e$ (S405). Based on the estimated charge/discharge electricity amount $\Delta Q_e$ thus calculated, the polarization voltage $V_{pe}$ is recalculated (S211) and the state of charge (SOC) is calculated (S212).

In this manner, the state of charge (SOC) and polarization voltage $V_{pe}$ in the battery blocks of the battery pack 100 are estimated.

Figure 6:
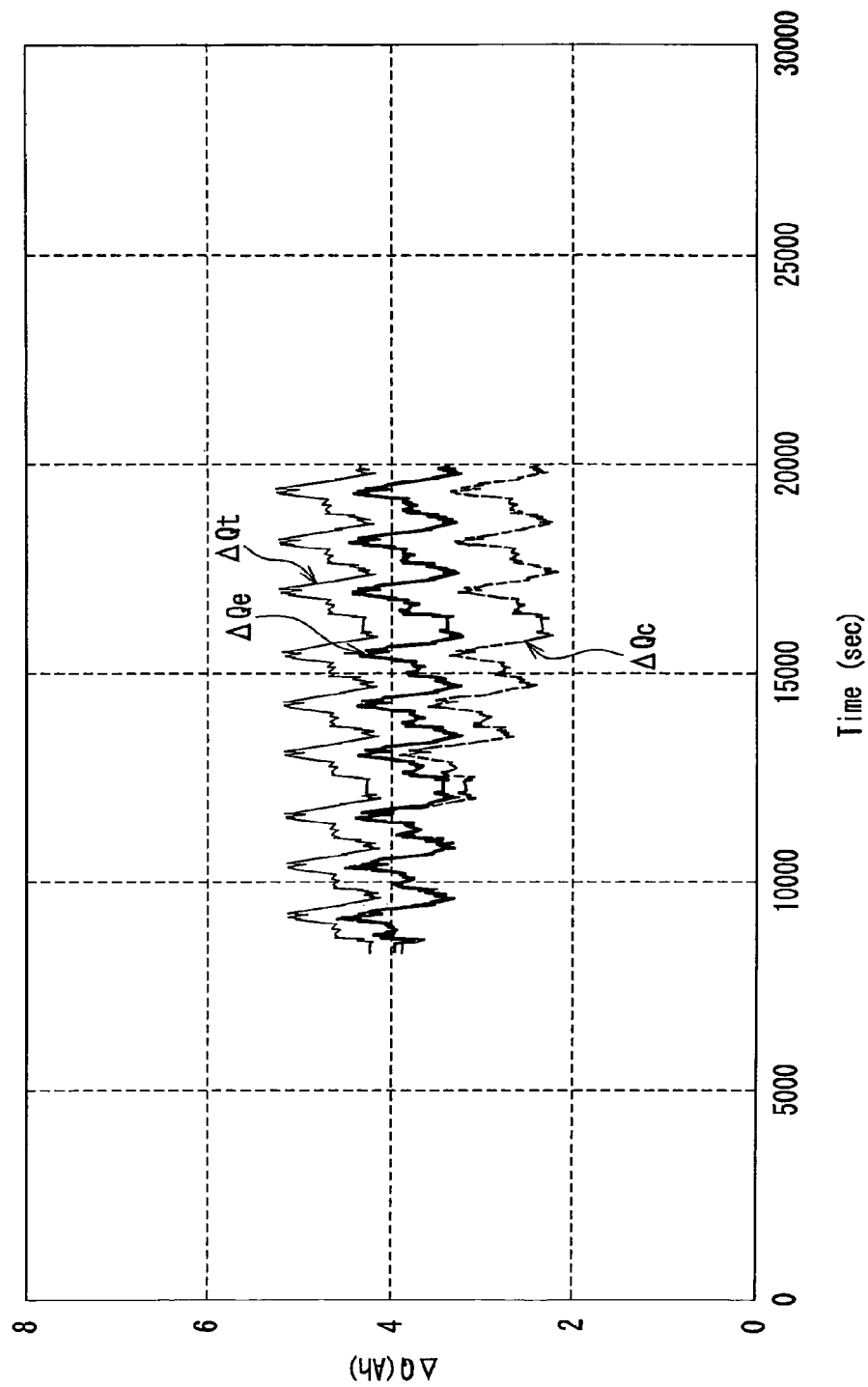
FIG. 6 is a graph of the change over time of: the estimated charge/discharge electricity amount $\Delta Q_e$ calculated based on the flowchart of FIG. 5, the estimated charge/discharge electricity amount $\Delta Q_c$ calculated by a method that does not use the compensation coefficient $\alpha$ in the flowchart of FIG. 5, and the true charge/discharge electricity amount $\Delta Q_t$ calculated based on the integral of the current measured using a high-precision current sensor.

FIG. 6 is a graph of the change over time of: the estimated charge/discharge electricity amount $\Delta Q_e$ calculated based on the flowchart of FIG. 5, the estimated charge/discharge electricity amount $\Delta Q_c$ calculated by a method that does not use the compensation coefficient $\alpha$ in the flowchart of FIG. 5, and the charge/discharge electricity amount $\Delta Q_t$ (referred to in this specification as the "true charge/discharge electricity amount") calculated based on the integral of the current measured using a high-precision current sensor (with no current error).

As shown in FIG. 6, with the present embodiment, the estimated charge/discharge electricity amount $\Delta Q_e$ approaches the true charge/discharge electricity amount $\Delta Q_t$.

INDUSTRIAL APPLICABILITY

As described above, the method and apparatus for estimating the charge/discharge electricity amount of a secondary battery according to the present invention calculates an estimated charge/discharge electricity amount that does not contain current measurement error from a measured voltage (no-load voltage or open circuit voltage) that is not greatly affected by current measurement error, or from a measured charge/discharge electricity amount that contains current measurement error. In addition, the method and apparatus for estimating the polarization voltage of a secondary battery and the method and apparatus for estimating the state of charge of a secondary battery according to the present invention uses an estimated charge/discharge electricity amount that does not contain current measurement error to calculate an estimated polarization voltage and state of charge (SOC) that do not depend on current measurement error. The present invention is thus useful when applied to a pure electric vehicle (PEV), hybrid electric vehicle (HEV), hybrid vehicle that has both fuel cells and secondary batteries or other electric vehicles or the like that require high precision in the estimation of the state of charge (SOC).

The invention claimed is:

1. A method for estimating a charge/discharge electricity amount of a secondary battery comprising:
   measuring a pair of data consisting of a current flowing through the secondary battery and a terminal voltage of the secondary battery corresponding to the current, thus obtaining a plurality of pairs of data;
   if specific selection conditions are satisfied, the specific selection conditions including (i) the current in charging and discharging the secondary battery is within a first predetermined range, (ii) a number of the plurality of pairs of data greater than or equal to a predetermined number, and (iii) a charge/discharge electricity amount during collection of the plurality of pairs of data is within a second predetermined range, calculating a no-load voltage as a voltage intercept at a current of zero in a straight-line approximation obtained by statistical processing with respect to the plurality of pairs of data;
   if the specific selection conditions are not satisfied and if one of specific current conditions or voltage conditions continue to be met for a certain amount of time, calculating an open circuit voltage from the terminal voltage of the secondary battery, the component resistance of the secondary battery and an average current;
   calculating a change ($\Delta V_b$) in the no-load voltage or the open circuit voltage over a predetermined period of time;
   calculating an estimated charge/discharge electricity amount ($\Delta Q_e$) of the secondary battery based on the change in the no-load voltage or the open circuit voltage; and
   calculating a measured charge/discharge electricity amount over the predetermined period of time from the current flowing through the secondary battery.

2. The method for estimating a charge/discharge electricity amount of a secondary battery according to claim 1, further comprising calculating a polarization voltage of the secondary battery based on the measured charge/discharge electricity amount.

3. The method for estimating a charge/discharge electricity amount of a secondary battery according to claim 2, further comprising calculating an electromotive force of the secondary battery based on the measured charge/discharge electricity amount.

4. The method for estimating a charge/discharge electricity amount of a secondary battery according to claim 3, further comprising calculating a change in the polarization voltage and a change in the electromotive force over the predetermined period of time.

5. The method for estimating a charge/discharge electricity amount of a secondary battery according to claim 4, wherein calculating the estimated charge/discharge electricity amount is performed based on the change in the polarization voltage, the change in the electromotive force and the change in the no-load voltage or the open circuit voltage.

6. The method for estimating a charge/discharge electricity amount of a secondary battery according to claim 5 wherein calculating the estimated charge/discharge electricity amount comprises:
   calculating a compensation coefficient with respect to the measured charge/discharge electricity amount based on the change in the polarization voltage, the change in the electromotive force and the change in the no-load voltage or the open circuit voltage; and
   multiplying the measured charge/discharge electricity amount by the compensation coefficient.

7. The method for estimating a charge/discharge electricity amount of a secondary battery according to claim 6, wherein, when $\Delta V_{pol}$ is the change in the polarization voltage, $\Delta V_{eq}$ is the change in the electromotive force, $\Delta V_b$ is the change in the no-load voltage or the open circuit voltage, and $\alpha$ is the compensation coefficient, the compensation coefficient $\alpha$ is expressed as $\alpha = \Delta V_b/(\Delta V_{pol} + \Delta V_{eq})$.

8. The method for estimating a charge/discharge electricity amount of a secondary battery according to claim 5, wherein:
   calculating the polarization voltage is performed based on the measured charge/discharge electricity amount; and
   calculating the polarization voltage is performed based on the estimated charge/discharge electricity amount calculated for the previous predetermined amount of time.

9. The method for estimating a charge/discharge electricity amount of a secondary battery according to claim 5, wherein:
   calculating the electromotive force is performed based on the measured charge/discharge electricity amount; and
   calculating the electromotive force is performed based on the estimated charge/discharge electricity amount calculated for the previous predetermined amount of time.

10. The method for estimating a charge/discharge electricity amount of a secondary battery according to claim 5, wherein calculating the polarization voltage is performed with reference to a polarization voltage-charge/discharge electricity amount characteristic prepared in advance with temperature as a parameter.

11. The method for estimating a charge/discharge electricity amount of a secondary battery according to claim 5, wherein calculating the electromotive force is performed with reference to an electromotive force-state of charge characteristic prepared in advance with temperature as a parameter, based on the sum of the measured charge/discharge electricity amount and the state of charge calculated for the previous predetermined amount of time.

12. An apparatus for estimating a charge/discharge electricity amount of a secondary battery, comprising:

a current measurement part that measures current flowing through the secondary battery as current data;

a voltage measurement part that measures a terminal voltage of the secondary battery as voltage data;

a no-load voltage calculation part that obtains a plurality of pairs of data consisting of current data from the current measurement part and voltage data corresponding to this current data from the voltage measurement part, and that, in the case that specific selection conditions are satisfied, the specific selection conditions including (i) the current in charging and discharging the secondary battery is within a first predetermined range, (ii) a number of the plurality of pairs of data greater than or equal to a predetermined number, and (iii) a charge/discharge electricity amount during collection of the plurality of pairs of data is within a second predetermined range, calculates a no-load voltage as a voltage intercept at a current of zero in a straight-line approximation obtained by statistical processing with respect to the plurality of pairs of data;

an open circuit voltage calculation part that, in the case that the specific selection conditions are not satisfied and specific current conditions or voltage conditions continue to be met for a certain amount of time, calculates an open circuit voltage from the terminal voltage of the secondary battery, the component resistance of the secondary battery and an average current;

a change-in-measured-voltage calculation part that calculates a change ($\Delta V_b$) in the no-load voltage or the open circuit voltage over a predetermined period of time;

an estimated charge/discharge electricity amount calculation part that calculates an estimated charge/discharge electricity amount ($\Delta Q_e$) of the secondary battery based on the change in the no-load voltage or the open circuit voltage; and a measured charge/discharge electricity amount calculation part that calculates a measured charge/discharge electricity amount over the predetermined period of time from the current flowing through the secondary battery.

13. The apparatus for estimating a charge/discharge electricity amount of a secondary battery according to claim 12, further comprising a polarization voltage calculation part that calculates a polarization voltage of the secondary battery based on the measured charge/discharge electricity amount.

14. The apparatus for estimating a charge/discharge electricity amount of a secondary battery according to claim 13, further comprising an electromotive force calculation part that calculates an electromotive force of the secondary battery based on the measured charge/discharge electricity amount.

15. The apparatus for estimating a charge/discharge electricity amount of a secondary battery according to claim 14, further comprising a change-in-polarization-voltage calculation part that calculates a change in the polarization voltage over the predetermined period of time.

16. The apparatus for estimating a charge/discharge electricity amount of a secondary battery according to claim 15, further comprising a change-in-electromotive-force calculation part that calculates a change in the electromotive force over the predetermined period of time.

17. The apparatus for estimating a charge/discharge electricity amount of a secondary battery according to claim 16, wherein the estimated charge/discharge electricity amount calculation part calculates the estimated charge/discharge electricity amount based on the change in the polarization voltage, the change in the electromotive force and the change in the no-load voltage or the open circuit voltage.

18. The apparatus for estimating a charge/discharge electricity amount of a secondary battery according to claim 17, wherein the estimated charge/discharge electricity amount calculation part comprises a compensation coefficient calculation part that calculates a compensation coefficient with respect to the measured charge/discharge electricity amount based on the change in the polarization voltage, the change in the electromotive force and the change in the no-load voltage or the open circuit voltage, and the estimated charge/discharge electricity amount is calculated by multiplying the measured charge/discharge electricity amount by the compensation coefficient.

19. The apparatus for estimating a charge/discharge electricity amount of a secondary battery according to claim 18, wherein when $\Delta V_{pol}$ is the change in the polarization voltage, $\Delta V_{eq}$ is the change in the electromotive force, $\Delta V_b$ is the change in the no-load voltage or the open circuit voltage, and $\alpha$ is the compensation coefficient, the compensation coefficient $\alpha$ is expressed as $\alpha \Delta V_b/(\Delta V_{pol}+\Delta V_{eq})$.

20. The apparatus for estimating a charge/discharge electricity amount of a secondary battery according to claim 17, wherein the polarization voltage calculation part calculates the polarization voltage based on the measured charge/discharge electricity amount and the polarization voltage calculated based on the estimated charge/discharge electricity amount calculated for the previous predetermined amount of time.

21. The apparatus for estimating a charge/discharge electricity amount of a secondary battery according to claim 17, wherein the electromotive force calculation part calculates the electromotive force based on the measured charge/discharge electricity amount and the electromotive force calculated based on the estimated charge/discharge electricity amount calculated for the previous predetermined amount of time.

22. The apparatus for estimating a charge/discharge electricity amount of a secondary battery according to claim 17, further comprising a temperature measurement part that measures a temperature of the secondary battery as temperature data, wherein the polarization voltage calculation part calculates the polarization voltage with reference to a polarization voltage-charge/discharge electricity amount characteristic prepared in advance with the temperature data from the temperature measurement part as a parameter.

23. The apparatus for estimating a charge/discharge electricity amount of a secondary battery according to claim 17, further comprising a temperature measurement part that measures a temperature of the secondary battery as temperature data, wherein the electromotive force calculation part calculates the electromotive force with reference to an electromotive force-state of charge characteristic prepared in advance with the temperature data from the temperature measurement part as a parameter, based on the sum of the measured charge/discharge electricity amount and the state of charge calculated for the previous predetermined amount of time.

* * * * *